United States Patent
Koenen (10) Patent No.: US 9,651,877 B2
(45) Date of Patent: May 16, 2017

(54) POSITION MEASUREMENT SYSTEM, GRATING FOR A POSITION MEASUREMENT SYSTEM AND METHOD

(71) Applicant: ASML Netherlands B.V., Veldhoven (NL)

(72) Inventor: Willem Herman Gertruda Anna Koenen, Roermond (NL)

(73) Assignee: ASML NETHERLANDS B.V., Veldhoven (NL)

( * ) Notice: Subject to any disclaimer, the term of this patent is extended or adjusted under 35 U.S.C. 154(b) by 76 days.

(21) Appl. No.: 14/439,130

(22) PCT Filed: Nov. 8, 2013

(86) PCT No.: PCT/EP2013/073392
§ 371 (c)(1),
(2) Date: Apr. 28, 2015

(87) PCT Pub. No.: WO2014/076009
PCT Pub. Date: May 22, 2014

(65) Prior Publication Data
US 2015/0316856 A1    Nov. 5, 2015

Related U.S. Application Data (60) Provisional application No. 61/728,071, filed on Nov. 19, 2012.

(51) Int. Cl.
*G03F 9/00*        (2006.01)
*G03F 7/20*        (2006.01)
(Continued)

(52) U.S. Cl.
CPC ........... *G03F 9/7076* (2013.01); *G01D 5/347* (2013.01); *G01D 5/34776* (2013.01); *G01D 5/38* (2013.01);
(Continued)

(58) Field of Classification Search
CPC ...... G01D 5/347; G01D 5/34776; G01D 5/38; G02B 5/1838; G02B 5/1861;
(Continued)

(56) References Cited

U.S. PATENT DOCUMENTS

| 5,204,524 A | 4/1993 | Ichikawa et al. |
| 5,648,658 A | 7/1997 | Holzapfel et al. |

(Continued)

FOREIGN PATENT DOCUMENTS

| EP | 2 511 666 | 10/2012 |
| JP | 8-191043 A | 7/1996 |

(Continued)

OTHER PUBLICATIONS

Japanese Office Action mailed May 18, 2016 in corresponding Japanese Patent Application No. 2015-542227 (14 pages).
(Continued)

*Primary Examiner* — Michelle M Iacoletti
(74) *Attorney, Agent, or Firm* — Pillsbury Winthrop Shaw Pittman LLP (57) ABSTRACT

A position measurement system to determine a position of a first object relative to a second object, includes an encoder head mounted on the first object, a grating mounted on the second object, wherein the grating includes a first array of grating lines in a first direction and a second array of grating lines in a second direction to diffract a measurement beam incident on the first and second arrays in at least one first diffracted beam in the first direction and in at least one second diffracted beam in the second direction, wherein the first diffracted beam is for position measurement in the first direction and the second diffracted beam is for position measurement in the second direction, wherein the measure-
(Continued)

ment beam has a power quantity, and the grating is configured to distribute the power quantity unevenly over the first and second diffracted beams.

19 Claims, 4 Drawing Sheets

(51) Int. Cl.
  *G01D 5/347* (2006.01)
  *G02B 5/18* (2006.01)
  *G01D 5/38* (2006.01)

(52) U.S. Cl.
  CPC ....... *G02B 5/1861* (2013.01); *G03F 7/70133* (2013.01); *G03F 7/70775* (2013.01); *G03F 9/7049* (2013.01); *G03F 9/7088* (2013.01)

(58) Field of Classification Search
  CPC ............ G03F 7/70133; G03F 7/70775; G03F 9/7049; G03F 9/7046; G03F 9/7076; G03F 9/7088
  See application file for complete search history.

(56) References Cited

U.S. PATENT DOCUMENTS

| | | | |
|---|---|---|---|
| 5,906,901 A | 5/1999 | Tanimoto | |
| 7,483,120 B2 | 1/2009 | Luttikhuis et al. | |
| 8,319,940 B2 | 11/2012 | Butler et al. | |
| 8,928,882 B2 | 1/2015 | Imaoka | |
| 2004/0012794 A1 | 1/2004 | Nahum et al. | |
| 2008/0282566 A1 | 11/2008 | Holzapfel | |
| 2009/0115987 A1 | 5/2009 | Butler et al. | |
| 2011/0051109 A1 | 3/2011 | Emoto et al. | |
| 2012/0044470 A1 | 2/2012 | Smilde et al. | |
| 2012/0258391 A1 | 10/2012 | Imaoka | |
| 2012/0261561 A1 | 10/2012 | Horiguchi et al. | |
| 2013/0128255 A1 | 5/2013 | Liu | |

FOREIGN PATENT DOCUMENTS

| | | |
|---|---|---|
| JP | 2007-318119 A | 12/2007 |
| JP | 2009-281946 | 12/2009 |
| JP | 2011-54694 A | 3/2011 |
| JP | 2011-127981 | 6/2011 |
| JP | 2012-225907 A | 11/2012 |
| TW | 201232060 | 8/2012 |
| WO | WO 2008/072502 A1 | 6/2008 |

OTHER PUBLICATIONS

Korean Office Action mailed May 30, 2016 in corresponding Korean Patent Application No. 10-2015-7016256 (13 pages).
Singapore Written Opinion issued Jun. 27, 2016 in corresponding Singapore Patent Application No. 11201503261T (6 pages).
Taiwan Office Action dated Jul. 17, 2015 in Taiwanese Patent Application No. 102141322 ( 6 pages).
International Search Report and Written Opinion mailed May 26, 2014 in corresponding International Patent Application No. PCT/EP2013/073392.

POSITION MEASUREMENT SYSTEM, GRATING FOR A POSITION MEASUREMENT SYSTEM AND METHOD

CROSS-REFERENCE TO RELATED APPLICATIONS

This application is the U.S. National Stage of PCT/EP2013/073392, filed Nov. 8, 2013, which in turn claims the benefit of U.S. provisional application 61/728,071, which was filed on Nov. 19, 2012, the contents of all of these applications being incorporated herein in their entirety by reference.

FIELD

The present invention relates to a position measurement system, grating for a position measurement system and method.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In the known lithographic apparatus movable objects, such as a movable substrate support and a movable patterning device support are used. These movable objects may be moved with high accuracy. To determine the position of the movable objects, position measurement systems capable of measuring a position with high accuracy are provided. For example, interferometer systems and encoder measurement systems have been provided for high accuracy position measurement of movable objects in a lithographic apparatus.

An encoder-type measurement system comprises at least one encoder head and a grating, for example arranged on a reference plate or other reference element. The encoder head may be any type of encoder sensor capable of reading the grating.

The encoder head may be mounted on a first object and the grating on the second object. The grating comprises periodic array of grating lines, and the encoder head is configured to read the periodic array of grating lines in order to determine a change in a relative position of the first object with respect to the second object by counting the grating lines that pass during a relative movement. In some embodiments, the encoder head may determine, within a range of a relatively small number of grating lines, an absolute position with respect to this range of grating lines. Since, globally, the encoder head can only determine a position change of the encoder head with respect to the grating and not an absolute position, it is desirable to know a zero position or start position of the encoder head with respect to the grating in order to make determination of an absolute global position of the first object with respect to the second object possible.

The grating may be a two-dimensional grating configured to be used in at least two measurement directions. Such two-dimensional grating comprises a first array of grating lines in a first direction and a second array of grating lines in a second direction, wherein the first array of grating lines and the second array of grating lines overlap. The first direction and the second direction are perpendicular with respect to each other. The first array of grating lines and the second array of grating lines diffract a measurement beam incident on the grating in at least one first diffracted beam in the first direction and at least one second diffracted beam in the second direction. The at least one first diffracted beam and/or at least one second diffracted beam are received by the encoder head and used for position measurement in the first direction and the second direction, respectively.

The grating may be used by different encoder sensors having different measurement directions in the plane of the grating.

In the known encoder-type position measurement system having a two-dimensional grating, with increasing number of encoder heads which may be desirable to increase overall accuracy of the position measurement system, more laser power is desired to use the encoder heads adequately. This laser power is provided by one or more laser sources, for example laser boxes. Increasing laser power requires a laser source having increased power or multiple laser sources. A laser source having increased power or multiple laser sources may substantially increase costs, weight and volume for integration of the laser source or sources. Multiple laser sources further necessitate synchronization of the different laser sources.

Further, in the known encoder-type position measurement system, the known grating is not suitable to determine an absolute global position of the encoder head with respect to the grating without having a negative influence on high accuracy measurement at the location where an absolute global position is measured.

In an embodiment of a known position measurement system a separate absolute position sensor is provided which is configured to determine an absolute position of the encoder head with respect to the grating. This absolute position sensor comprises a sensor which is configured to read a mark arranged at a fixed position with respect to the grating.

In another known embodiment, the grating itself is provided with a local mark. When the encoder head of the position measurement system is aligned with this local mark, the encoder head will determine the presence of this mark, and, as a result, an absolute position of the encoder head with respect to the grating can be determined. However, the presence of such local mark has a negative influence on high accuracy measurement at the area of the local mark. Therefore, such local mark is not suitable for determination of an absolute position in areas where high accuracy measurement is desirable.

SUMMARY

Generally, it is desirable to provide an improved position measurement system, in particular an encoder-type measurement system comprising a diffraction grating, using available measurement beam power efficiently. Further, it may be desirable to reduce the required laser power in relation to the desired accuracy of the position measurement system. Also, it may be desirable to provide a grating which provides a zeroing location for the encoder head of the position measurement system.

According to an embodiment of the invention, there is provided position measurement system configured to determine a position of a first object relative to a second object, comprising: an encoder head mounted on the first object, a grating mounted on the second object, wherein the grating comprises a first array of grating lines in a first direction and a second array of grating lines in a second direction to diffract a measurement beam incident on the first and second arrays in at least one first diffracted beam in the first direction and in at least one second diffracted beam in the second direction, wherein the at least one first diffracted beam is for position measurement in the first direction and wherein the at least one second diffracted beam is for position measurement in the second direction, wherein the measurement beam has a power quantity, and wherein the grating is configured to distribute the power quantity unevenly over the at least one first diffracted beam and the at least one second diffracted beam.

According to an embodiment of the invention, there is provided a grating for a position measurement system, wherein the grating comprises a first array of grating lines in a first direction and a second array of grating lines in a second direction to diffract a measurement beam incident on the first and second arrays in at least one first diffracted beam in the first direction and in at least one second diffracted beam in the second direction, wherein the at least one first diffracted beam is used for position measurement in the first direction and wherein the at least one second diffracted beam is used for position measurement in the second direction, wherein the measurement beam has a power quantity, and wherein the grating is configured to distribute the power quantity unevenly over the at least one first diffracted beam and the at least one second diffracted beam.

According to an embodiment of the invention, there is provided a method to determine a position of a first object relative to a second object, comprising: providing an encoder head on the first object, providing a grating on the second object, wherein the grating comprises a first array of grating lines in a first direction and a second array of grating lines in a second direction to diffract a measurement beam incident on the first and second arrays in at least one first diffracted beam in the first direction and in at least one second diffracted beam in the second direction, wherein the at least one first diffracted beam is used for position measurement in the first direction and wherein the at least one second diffracted beam is used for position measurement in the second direction, projecting by the encoder head a measurement beam on the grating, wherein the measurement beam has a power quantity, and wherein the grating is configured to distribute the power quantity unevenly over the at least one first diffracted beam and the at least one second diffracted beam, receiving by the encoder head the at least one first diffracted beam and the at least one second diffracted beam, and determining a position of the first object relative to the second object on the basis of the at least one first diffracted beam and/or the at least one second diffracted beam.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
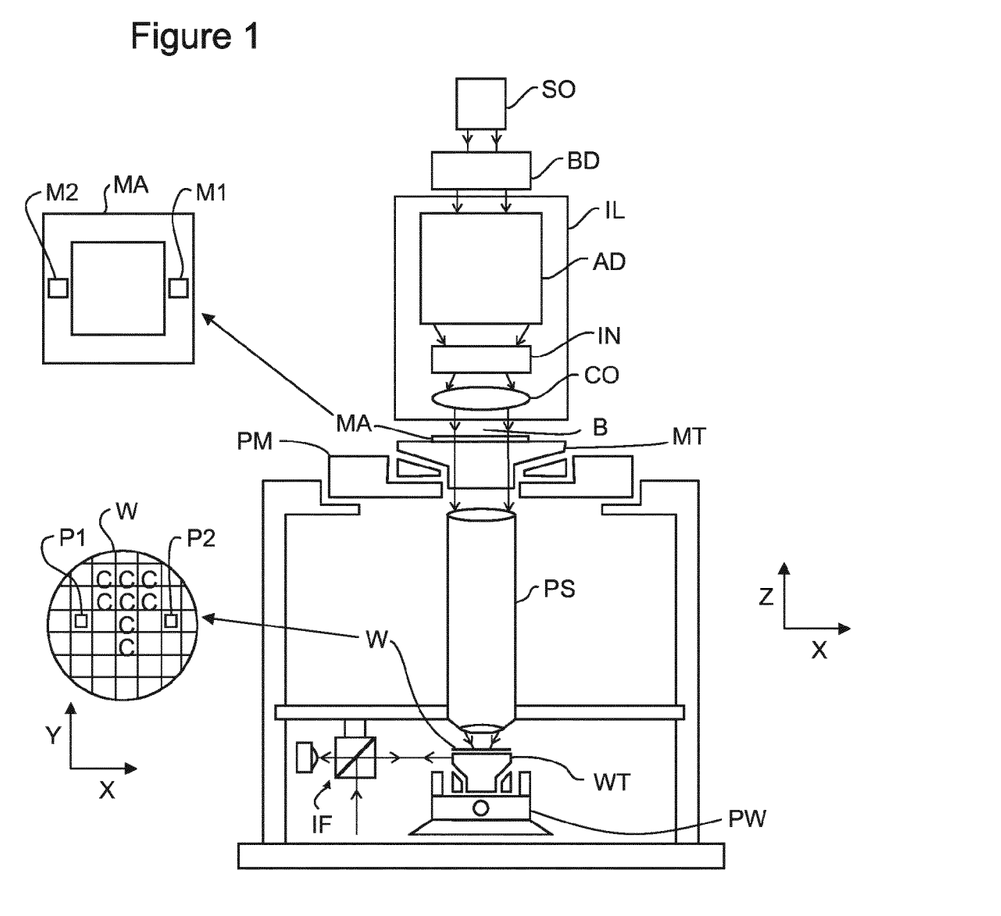
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a support structure or patterning device support (e.g. a mask table) MT constructed to support a patterning device MA and connected to a first positioning device PM configured to accurately position the patterning device in accordance with certain parameters. The apparatus also includes a substrate table WT (e.g. a wafer table or substrate support) constructed to hold a substrate (e.g. a resist-coated wafer) W and connected to a second positioning device PW configured to accurately position the substrate W in accordance with certain parameters. The apparatus further includes a projection system PS configured to project a pattern imparted to the radiation beam B by patterning device MA onto a target portion C (e.g. including one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT supports, i.e. bears the weight of, the patterning device MA. It holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS.

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit. The terms "reticle" and "mask" may be considered synonymous with the more general term "patterning device."

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure. Alternatively or in addition, the apparatus may have a substrate table and a measurement table. The measurement table is arranged to carry measurement equipment, such as sensors. The measurement table may not be arranged to hold a substrate.

The lithographic apparatus may also be of a type wherein at least a portion of the substrate W may be covered by a liquid having a relatively high refractive index, e.g. water, so as to fill a space between the projection system PS and the substrate W. An immersion liquid may also be applied to other spaces in the lithographic apparatus, for example, between the patterning device MA and the projection system PS. Immersion techniques can be used to increase the numerical aperture of the projection system PS. The term "immersion" as used herein does not mean that a structure, such as a substrate W, must be submerged in liquid, but rather only means that a liquid is located between the projection system PS and the substrate W during exposure.

Referring to FIG. 1, the illumination system IL receives a radiation beam from a radiation source SO. The source SO and the lithographic apparatus may be separate entities, for example when the source SO is an excimer laser. In such cases, the source SO is not considered to form part of the lithographic apparatus and the radiation beam is passed from the source SO to the illumination system IL with the aid of a beam delivery system BD including, for example, suitable directing mirrors and/or a beam expander. In other cases the source may be an integral part of the lithographic apparatus, for example when the source is a mercury lamp. The source SO and the illumination system IL, together with the beam delivery system BD if required, may be referred to as a radiation system.

The illumination system IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illumination system IL can be adjusted. In addition, the illumination system IL may include various other components, such as an integrator IN and a condenser CO. The illumination system IL may be used to condition the radiation beam, to have a desired uniformity and intensity distribution in its cross-section.

The radiation beam B is incident on the patterning device MA, which is held on the support structure MT, and is patterned by the patterning device MA. Having traversed the patterning device MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module and a short-stroke module, which form part of the first positioning device PM. The long-stroke module may be arranged to move the short-stroke module over a large range with limit accuracy. The short-stroke module may be arranged to move the support structure MT relative to the long-stroke module over a small range with a high accuracy. Similarly, movement of the substrate table WT may be realized using a long-stroke module and a short-stroke module, which form part of the second positioner PW. In the case of a stepper (as opposed to a scanner) the patterning device support MT may be connected to a short-stroke actuator only, or may be fixed. Patterning device MA and substrate W may be aligned using patterning device alignment marks M1, M2 and substrate alignment marks P1, P2. Although the substrate alignment marks P1, P2 as illustrated occupy dedicated target portions, they may be located in spaces between target portions C. Similarly, in situations in which more than one die is provided on the patterning device MA, the patterning device alignment marks may be located between the dies.

The depicted apparatus could be used in at least one of the three following modes.

The first mode is the so-called step mode. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

The second mode is the so-called scan mode. In scan mode, the support structure MT or and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion C.

In the third mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
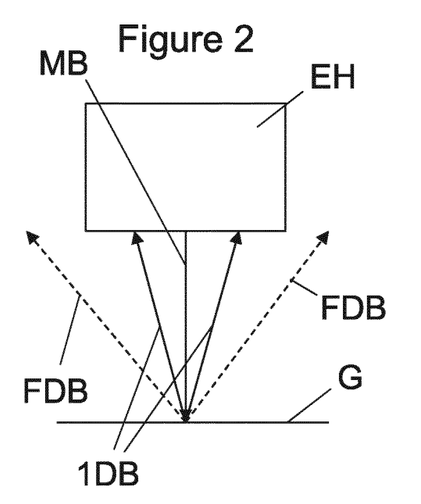
FIG. 2 depicts schematically a side view on an encoder head and a two-dimensional grating.
Figure 3:
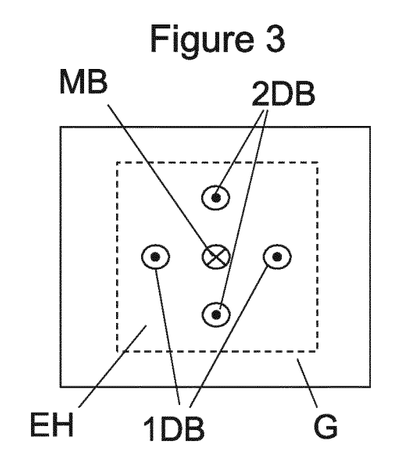
FIG. 3 depicts schematically a top view on an encoder head and a two-dimensional grating.

FIG. 2 shows a side view of an encoder head EH and a grating G of a position measurement system according to an embodiment of the invention. The position measurement system may be part of the position sensor IF as described in the embodiment of FIG. 1. FIG. 3 shows a top view on the encoder head EH and a part of the grating G. The encoder head EH may be an optical encoder head.

The encoder head EH may be mounted on a first object, for example a substrate stage WS and the grating G is mounted on a second object, for example a metrology frame. In an embodiment, multiple encoder heads EH may be mounted on the first object to cooperate with the grating G, and also multiple gratings G may be provided and used in cooperation with the one or more encoder heads EH. Alternatively, at least one grating G is mounted on the substrate stage WS, and at least one encoder head EH is mounted on a reference frame. The reference frame may be substantially stationary relative to the projection system PS. The reference frame may support the projection system PS. The substrate stage WS may comprise a first surface and a second surface. The first surface may be on a top side of the substrate stage WS. The second surface may be on a bottom side of the substrate stage WS. The first surface may be arranged to hold the wafer. The second surface may be arranged to hold the grating.

In FIGS. 2 and 3 only a small part of the grating G is shown. In an embodiment, the grating G may extend over a larger range so that movement of the encoder head EH relative to the grating G can be determined over this larger range.

The encoder head EH is configured to emit a measurement beam MB towards the grating G. The grating G comprises a first array of grating lines in a first direction and a second array of grating lines in a second direction in an overlapping manner to diffract the measurement beam MB incident on the first and second arrays in at least one first diffracted beam 1DB in the first direction and in at least one second diffracted beam 2DB in the second direction. 2. The first array may be arranged to diffract the measurement beam incident on the first array in the at least one first diffracted beam 2DB. The second array may be arranged to diffract the measurement beam incident on the second array in the at least one second diffracted beam 2DB. The at least one first diffracted beam 1DB and the at least one second diffracted beam 2DB are received by the encoder head EH and used to determine a change in position of the encoder head EH relative to the grating G. The at least one first diffracted beam 1DB comprises all diffracted beams used by the respective encoder head EH for position measurement in the first direction and the at least one second diffracted beam 2DB comprises all diffracted beams used by the respective encoder head EH for position measurement in the second direction.

It is remarked that the grating G may also diffract the measurement beam MB to a further diffracted beam FDB that is not used for position measurement. The further diffracted beam FDB is not observed by the encoder head EH. The at least one first diffracted beam 1DB and the at least one second diffracted beam 2DB are, for example, first order diffracted beams, while the further diffracted beam FDB may for example comprise higher order beams or first order diffracted beams which run in other directions than the first direction or second direction.

Figure 4:
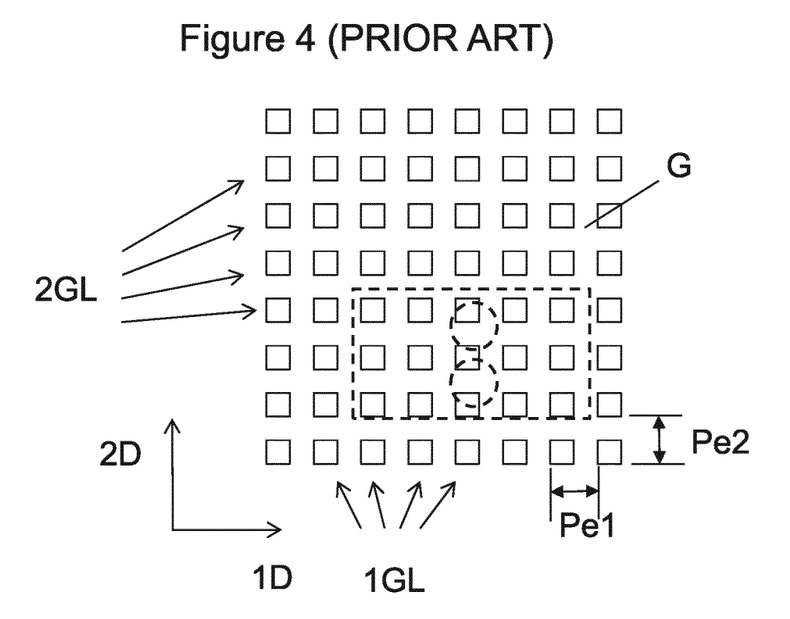
FIG. 4 depicts schematically a top view on a prior art two-dimensional grating.

FIG. 4 shows a top view of a prior art grating G. The grating G comprises a first array of grating lines 1GL in the first direction 1D and a second array of grating lines 2GL in the second direction 2D. The grating lines 1GL and grating lines 2GL are arranged perpendicular with respect to each other in an overlapping manner, so that the single grating lines of the first array run in the second direction and the single grating lines of the second array run in the first direction.

The grating lines 1GL, 2GL may be of any type suitable to obtain diffraction of the measurement beam MB on the grating G. The grating lines may for example be formed by slots machined in the surface of a grid plate which slots are filled with a material having a different refractive index than the material of the grid plate. It is remarked that the first array of grating lines 1GL and the second array of grating lines 2GL cross each other. As a result, a single grating line is not formed by a continuous line, for instance a continuous slot, but by an intermittently interrupted line, for example a series of slots extending in a direction perpendicular to the direction of the array of grating lines.

The first array of grating lines 1GL has a first period Pe1 and the second array of grating lines 2GL has a second period Pe2. The first period Pe1 and the second period Pe2 are the same, i.e. the subsequent grating lines of the first array and the second array are arranged at equidistant spaces.

The first array of grating lines 1GL has a first duty cycle and the second array of grating lines 2GL has a second duty cycle.

The duty cycle of a grating is the ratio of the width of a grating line, for example a slot width, to the period of the grating lines, i.e. the periodic distance between two adjacent grating lines.

In the embodiment of the prior art in FIG. 4, the first duty cycle of the first array of grating lines 1GL and the second duty cycle of the second array of grating lines GL2 are the same.

As a result, the characteristics of the grating G are the same in the first direction and the second direction. In particular, the power of the measurement beam is evenly divided over the at least one first diffracted beam in the first direction and the at least one second diffracted beam in the second direction, when the measurement beam is diffracted in the first direction and the second direction equally. As a consequence, the measurement accuracy in both directions as far as dependent on the power of the one or more first and second diffracted beams is substantially equal.

However, not in all situations or applications, both measurement directions, i.e. the first direction and the second direction are equally important. Often one of the first direction and the second direction is the main measurement direction, while the other of the first direction and the second direction is a sub measurement direction. In such case only in the main measurement direction high accuracy measurement may be required.

Figure 5:
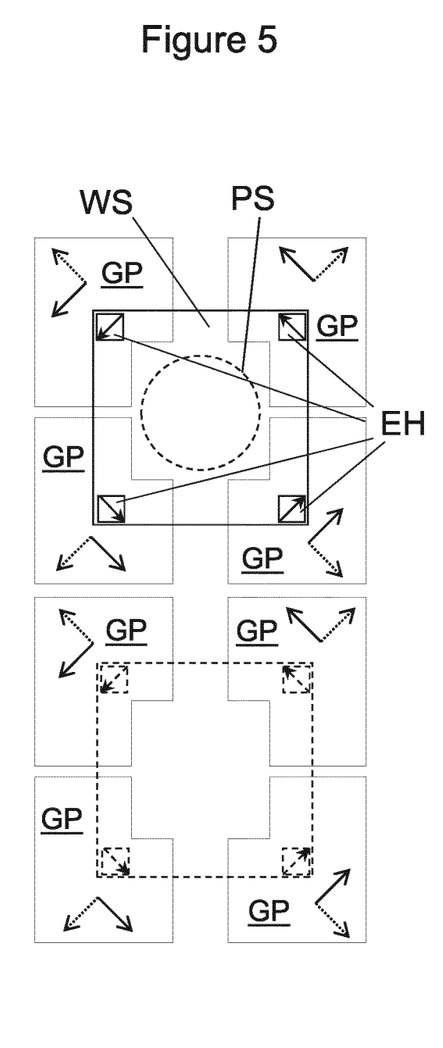
FIGS. 5 and 6 depict top views on a position measurement system of a lithographic apparatus with a substrate stage in different positions.
Figure 6:
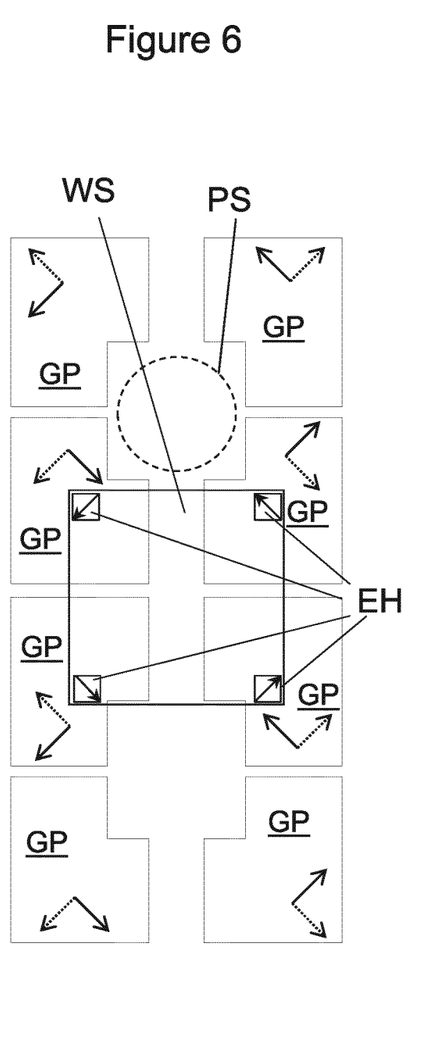

For example, FIGS. 5 and 6 show a top view of an encoder type measurement system of a substrate stage WS of a lithographic apparatus. The substrate stage WS comprises the substrate table WT and the second positioner PW. The position measurement system comprises eight grid plates GP each comprising a two-dimensional grating. The grid plates GP are mounted at a substantially stationary frame, such as the metrology frame. The substrate stage WS is movable with respect to the grid plates GP between different positions.

In FIG. 5, at the top side, the substrate stage WS is positioned in an exposure position at the exposure side of a lithographic apparatus, where a substrate W supported by the substrate stage WS is aligned with the projection system PS for projecting a patterned radiation beam on the substrate W. At the bottom side of FIG. 5, the substrate stage WS is shown (in dashed lines) in a measuring position at a measuring side of the lithographic apparatus. At this measuring side, the surface of the substrate W may be measured to obtain a surface map of the substrate W. This surface map is used during the exposure to increase positioning accuracy of the substrate W with respect to the projection system PS.

In FIG. 6, the substrate stage WS is shown in a transfer position between the exposure side and the measuring side of the lithographic apparatus.

The position measurement system comprises four encoder heads EH mounted on the substrate stage WS. Each of the encoder heads EH comprises a measurement direction indicated by an arrow in each of the encoder heads EH.

It is remarked that the encoder heads EH may also be configured to determine a position of the encoder head EH relative to the respective grid plate GP in a direction perpendicular or substantially perpendicular to the measurement plane of the grid plate GP.

In the exposure position and the measuring position, a high accuracy of the position measurement of the substrate stage WS is required, typically including determination of a local high accuracy absolute position within a small range of grating lines.

In the transfer position, the accuracy level of the position measurement may be lower than in the exposure position and the measuring position. For example, in the transfer position only the global change in position with respect to the grating lines is measured, while a local high accuracy absolute position within a small range of grating lines is not determined.

In FIGS. 5 and 6, the first direction and the second direction of the grating are indicated by a solid line arrow and a dotted line arrow, respectively. It can be seen that in the exposure position and the measuring position of the substrate stage WS, shown in FIG. 5, the measurement direction of the encoder head EH is parallel to the first direction of the grating of the grid plate GP with which the respective encoder head EH is aligned. However, in the transfer position of the substrate stage WS, as shown in FIG. 6, the measurement direction of the encoder heads EH are parallel to the second direction. Due to this arrangement of encoder heads EH and grid plates GP, position measurement in the first direction of each of the grid plates GP is more important than position measurement in the second direction thereof. Thus the first direction is the main measurement direction and the second direction is the sub measurement direction.

An embodiment of the present invention proposes to distribute the power quantity of the measurement beam MB, for instance the laser power of a laser measurement beam, unevenly over the at least one first diffracted beam 1DB and the at least one second diffracted beam 2DB. In the position measurement shown in FIGS. 5 and 6, it is desirable that the at least one first diffracted beam 1DB diffracted in the first direction receives relatively more power than the at least one second diffracted beam 2DB diffracted in the second direction, since in the positions where higher measurement accuracy is required, the measurement directions of the encoder heads EH are parallel with the first direction of the respective gratings.

By diffracting relatively more power of the measurement beam, usually a laser beam, into the first direction, the measurement accuracy of the encoder heads in the first direction may be increased. For example, the signal to noise ratio may be improved.

Alternatively, when it is assumed that with an even distribution of power in the first direction and the second direction, the power in the first direction is sufficient for high accuracy position measurement in the first direction, directing relatively more power to the first direction, results in less total laser power required for high accuracy position measurement. As a result, the total power provided to a single encoder head EH may be decreased and, for example, more encoder heads EH may be connected to a single laser source. This takes away the need to increase available laser power, by increasing laser power of a single laser source or by providing multiple laser sources, in case the total number of encoder heads EH has to be increased.

Figure 7:
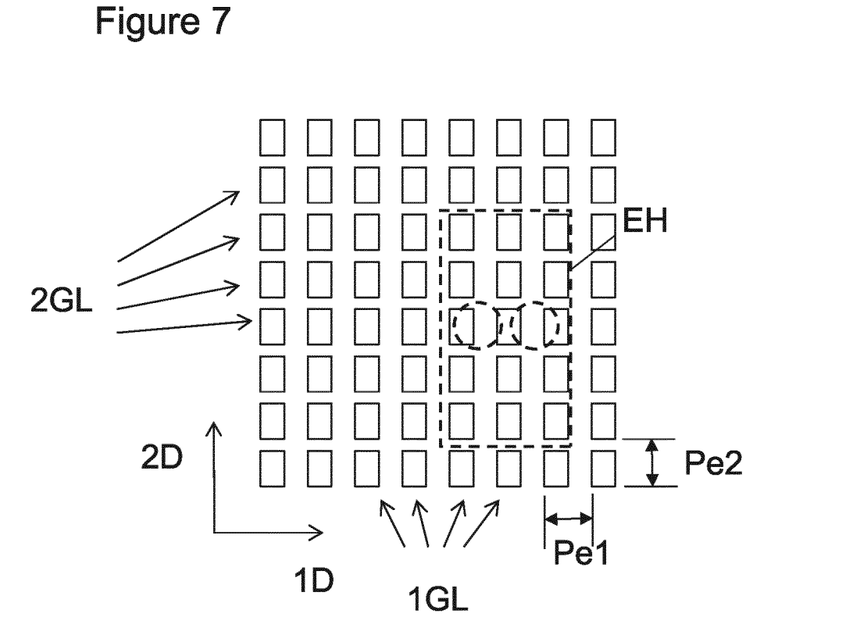
FIG. 7 depicts schematically a top view on a two-dimensional grating according to an embodiment of the invention.

FIG. 7 shows schematically an embodiment of a grating G in which the power distribution between the at least one first diffracted beam 1DB and the at least one second diffracted beam 2DB is uneven. The grating G comprises a first array of grating lines 1GL in the first direction and a second array of grating lines 2GL in the second direction. The first and second arrays are overlapping.

The grating lines 1GL in the first direction have a period Pe1. The grating lines 2GL in the second direction of grating G have a period Pe2. Period Pe1 is the same as period Pe2 so that the diffraction angles of the at least one first diffracted beam and the at least one second diffracted beam are corresponding.

However, the grating lines 1GL in the first direction comprise a first duty cycle and the grating lines 2GL in the second direction comprise a second duty cycle. The first duty cycle and the second duty cycle are different, as schematically indicated by the length/width of the grating elements forming the grating lines in the first direction and the second direction compared to the periodic distance between two adjacent grating lines.

The first duty cycle and the second duty cycle are selected such that the power distribution during diffraction of the measurement beam MB in the at least one first diffracted beam and at least one second diffracted beam is uneven. In particular, more laser power is directed to the first diffracted beams 1DB than to the second diffracted beams 2DB.

The difference between the first duty cycle of the first array of grating lines 1GL and the second duty cycle of the second array of grating lines 2GL is substantially the same over the whole grating G, such that for each measurement location on the grating G substantially the same uneven distribution of power between the at least one first diffracted beam and the at least one second diffracted beam is obtained.

In other embodiments, the power distribution between the at least one first diffracted beam 1DB and the at least one second diffracted beam 2DB may be even in some areas of the grating G while being uneven in other ranges of the grating G. Also, the ratio of power distribution between the at least one first diffracted beam and the at least one second diffracted beam may be different for different areas of the grating G.

It is remarked that any adaptation of the grating G, in particular of the grating lines resulting in an uneven distribution of the power of the measurement beam in the at least one first diffracted beam 1DB and the at least one second diffracted beam 2DB may be applied. In addition or as an alternative to adaptation of the first duty cycle and/or second duty cycle of the grating, the depth of the slots forming the grating lines in the first and second direction may be adapted and/or the angles of the slot walls may be adapted. Any other measure resulting in an uneven power distribution over the first diffracted beams 1DB used for position measurement in the first direction and the second diffracted beams 2DB used for position measurement in the second direction, may also be applied.

Figure 8:
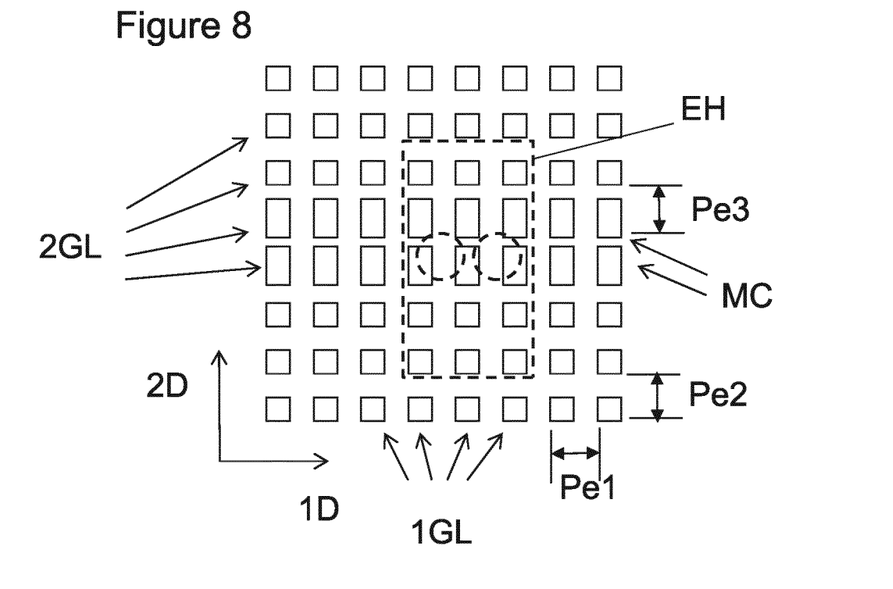
FIG. 8 depicts schematically a top view on a two-dimensional grating according to an embodiment of the invention.

FIG. 8 shows another example of using uneven distribution of laser power in the first direction and the second direction.

In the embodiment of FIG. 7, a grating G is proposed to direct relatively more power to the at least one first diffracted beam 1DB used for position measurement as this at least one first diffracted beam 1DB is diffracted in the first direction which is most important for position measurement.

In another approach, it can be concluded that since the at least one first diffracted beam 1DB is most important for position measurement, the power distributed to the at least one second diffracted beam 2DB is of less importance. This power distributed to the at least one second diffracted beam 2DB can also be used for other applications, in particular to obtain an absolute reference point, i.e. a zeroing location in the grating.

As explained above, the grating G comprises a first array of grating lines 1GL in the first direction and a second array of grating lines 2GL in the second direction. Since, in this embodiment, the first direction is the main measurement direction, the characteristics, such as period Pe1, of the first array of grating lines 1GL in the first direction are the same over the whole grating G. As a result, over the whole grating G, the same level of high accuracy position measurement in the first direction may be obtained.

In a portion of the second array of grating lines 2GL, there is a change duty cycle of the grating lines 2GL. The portion is schematically indicated by MC in FIG. 8. The duty cycle of the portion MC is different from the duty cycle of the other part of the second array.

When a measurement beam MB is incident on an area of the grating G comprising the portion MC, the second array of grating lines 2GL in the second direction will diffract the measurement beam MB incident on the grating in at least one first diffracted beam 1DB having the same power as in other areas of the grating G, at least one second diffracted beam 2DB having decreased power compared to other areas of the grating G and at least one or more further diffracted beams FDB.

The one or more further diffracted beams FDB may be diffracted in the first and/or second direction, but are not used for position measurement in the first or second direction.

The further diffracted beams FDB may be new beams which are only present when the measurement beam is directed to the portion MC and/or the further diffracted beams FDB may be further diffracted beams which are present over the whole surface area of the grating G, but which have at the portion MC increased power compared to other areas of the grating G.

As a result of this change in power distribution during diffraction, an encoder head EH measuring in the second direction will observe a power dip in the at least one second diffracted beam 2DB when the encoder head EH passes the portion MC. This power dip indicates an absolute location of the encoder head EH with respect to the grating G in the second direction. Thus, the portion MC can be used as an absolute reference location, i.e. a zeroing location, for obtaining, checking, correcting and/or resetting an absolute position obtained by the position measurement system.

This obviates the need for a separate absolute position sensor for zeroing the position measurement system.

As the power dip is only created in the diffracted beam relevant for the second direction, the passing of the portion MC does not have substantial influence on the high accuracy measurement obtained in the first direction.

It is remarked that a grating according to an embodiment of the invention may also comprise a combination of a global difference in power distribution between the one or more first diffracted beams 1DB and the one or more second diffracted beams 2DB, as for example shown in FIG. 7, and a local change in the grating lines in the second direction, as for example shown in the portion MC in FIG. 8.

Furthermore, it is remarked that in the embodiment of FIGS. 5 and 6, the first and second directions of the grid plates GP differ between different grid plates GP. Therefore, absolute position of the encoder heads with respect to the grid plates GP can be determined in multiple directions, whereby only measurements in the second directions are used.

Alternatively or in addition, the position measurement system described above may be used to determine a position of a moveable object other than the substrate stage WS. Instead, for example, a position of the support structure MT may be determined by mounting one of the encoderhead EH and the grating G on the support structure MT.

From the above, it will be appreciated that the power of the at least one second diffracted beam may also be used for other applications.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

While specific embodiments of the invention have been described above, it will be appreciated that the invention may be practiced otherwise than as described.

The descriptions above are intended to be illustrative, not limiting. Thus, it will be apparent to one skilled in the art that modifications may be made to the invention as described without departing from the scope of the claims set out below.

What is claimed is:

1. A position measurement system configured to determine a position of a first object relative to a second object, comprising:
    an encoder head mounted on the first object and configured to emit a measurement beam,
    a grating mounted on the second object and configured to diffract the measurement beam,
    wherein the grating comprises a first array of grating lines in a first direction and a second array of grating lines in a second direction to diffract the measurement beam incident on the first and second arrays in at least one first diffracted beam in the first direction and in at least one second diffracted beam in the second direction, wherein the at least one first diffracted beam is for position measurement in the first direction and wherein the at least one second diffracted beam is for position measurement in the second direction,
    wherein the measurement beam has a power quantity, and wherein the grating is configured to distribute the power quantity unevenly between the at least one first diffracted beam and the at least one second diffracted beam.

2. The position measurement system of claim 1, wherein the first array comprises a first period and a first duty cycle, wherein the second array comprises a second period and a second duty cycle, wherein the first period and the second period are the same, and wherein the first duty cycle is different from the second duty cycle.

3. The position measurement system of claim 1, wherein the first direction is a main measurement direction, and the second direction is a sub measurement direction, and wherein the grating is configured to distribute the power quantity of the measurement beam such that the at least one first diffracted beam has substantially more power than the at least one second diffracted beam.

4. The position measurement system of claim 1, wherein the grating is configured to distribute the power quantity over substantially the complete grating unevenly over the at least one first diffracted beam and the at least one second diffracted beam.

5. The position measurement system of claim 1, wherein a portion of the second array in the second direction comprises a third duty cycle different from the second duty cycle, wherein the position measurement system is arranged to determine an absolute position of the encoder head relative to the portion.

6. The position measurement system of claim 5, wherein the portion has a third period, wherein the second period and the third period are the same.

7. The position measurement system of claim 1, wherein the at least one first diffracted beam and the at least one second diffracted beam are first order diffraction beams of the measurement beam.

8. A lithographic apparatus comprising:
    a support structure constructed to support a patterning device comprising a pattern;
    a projection system configured to project the pattern on a substrate;
    a substrate stage constructed to hold the substrate; and
    a position measurement system according to claim 1,
    wherein the position measurement system is arranged to determine a position of one of the support structure and the substrate stage relative to the projection system.

9. The lithographic apparatus of claim 8, comprising a reference frame, wherein the grating is mounted on the substrate stage, and wherein the encoder head is mounted on the reference frame.

10. The lithographic apparatus of claim 8, wherein the substrate stage comprises a first surface and a second surface, wherein the first surface is on a top side of the substrate stage, wherein the second surface is at a bottom side of the substrate stage, wherein the first surface is arranged to hold the substrate, wherein the second surface is arranged to hold the grating.

11. A grating for a position measurement system that includes an encoder head configured to emit a measurement beam, wherein the grating comprises a first array of grating lines in a first direction and a second array of grating lines in a second direction to diffract the measurement beam incident on the first and second arrays in at least one first diffracted beam in the first direction and in at least one second diffracted beam in the second direction, wherein the at least one first diffracted beam is used for position measurement in the first direction and wherein the at least one second diffracted beam is used for position measurement in the second direction, wherein the measurement beam has a power quantity, and wherein the grating is configured to distribute the power quantity unevenly between the at least one first diffracted beam and the at least one second diffracted beam.

12. The grating of claim 11, wherein the first array comprises a first period and a first duty cycle, wherein the second array comprises a second period and a second duty cycle, wherein the first period and the second period are the same, and wherein the first duty cycle is different from the second duty cycle.

13. The grating of claim 12, wherein a portion of the second array comprises a third duty cycle different from the second duty cycle.

14. The grating of claim 13, wherein the portion has a third period, wherein the second period and the third period are the same.

15. A method to determine a position of a first object relative to a second object, comprising:

providing an encoder head on the first object, providing a grating on the second object, wherein the grating comprises a first array of grating lines in a first direction and a second array of grating lines in a second direction to diffract a measurement beam incident on the first and second arrays in at least one first diffracted beam in the first direction and in at least one second diffracted beam in the second direction, wherein the at least one first diffracted beam is used for position measurement in the first direction and wherein the at least one second diffracted beam is used for position measurement in the second direction, projecting by the encoder head a measurement beam on the grating, wherein the measurement beam has a power quantity, and wherein the grating is configured to distribute the power quantity unevenly between the at least one first diffracted beam and the at least one second diffracted beam, receiving by the encoder head the at least one first diffracted beam and the at least one second diffracted beam, and determining a position of the first object relative to the second object on the basis of the at least one first diffracted beam and/or the at least one second diffracted beam.

16. A diffraction grating comprising;

a first array of grating lines in a first direction;

a second array of grating lines in a second direction;

wherein the first array of grating lines comprises a first duty cycle, wherein the second array of grating lines comprises a second duty cycle, wherein the first duty cycle and the second duty cycle are different.

17. The diffraction grating of claim 16, wherein the difference between the first duty cycle and the second duty cycle is substantially the same over the whole grating.

18. The diffraction grating of claim 16, wherein a portion of the second array comprises a third duty cycle different from the second duty cycle.

19. The diffraction grating of claim 16, wherein the first array has a first period, wherein the second array has a second period, wherein the first period and the second period are the same.

* * * * *